United States Patent [19]

Takahashi et al.

[11] Patent Number: 4,904,937
[45] Date of Patent: Feb. 27, 1990

[54] APPARATUS FOR MAGNETICALLY DETECTING POSITIONS WITH MINIMUM LENGTH MAGNETIC INFORMATION UNITS RECORDED ON A PLURALITY OF MAGNETIC TRACKS

[75] Inventors: Tadashi Takahashi; Kunio Miyashita; Syooichi Kawamata, all of Hitachi, Japan

[73] Assignee: Hitachi, Ltd., Tokyo, Japan

[21] Appl. No.: 253,333

[22] Filed: Oct. 3, 1988

Related U.S. Application Data

[63] Continuation of Ser. No. 560,178, Dec. 12, 1983, abandoned.

[30] Foreign Application Priority Data

Dec. 13, 1982 [JP] Japan .................... 57-216899

[51] Int. Cl.$^4$ .............. G01B 7/30; G01P 3/487; G06K 7/08; G06K 19/06
[52] U.S. Cl. .................. 324/207.21; 235/449; 235/493; 324/174; 324/207.25; 341/15
[58] Field of Search ............... 324/207, 208, 167, 173, 324/174; 340/870.19, 870.2, 870.22, 349, 357, 672; 341/15; 235/449, 493; 310/156

[56] References Cited

U.S. PATENT DOCUMENTS

| | | | |
|---|---|---|---|
| 3,452,358 | 6/1969 | Zehner | 235/493 X |
| 3,484,780 | 12/1969 | Kamoi et al. | 340/870.22 X |
| 3,968,691 | 7/1976 | Balkanli | 340/870.22 X |
| 4,005,396 | 1/1977 | Fujiwara et al. | 340/870.22 X |
| 4,072,052 | 2/1978 | Lederer | 340/870.22 X |
| 4,146,873 | 3/1979 | Yamanaka et al. | 340/347 P |
| 4,274,053 | 6/1981 | Ito et al. | 324/174 |
| 4,315,252 | 2/1982 | Tagami | 340/347 P |
| 4,418,372 | 11/1983 | Hayashida et al. | 324/252 X |
| 4,599,561 | 7/1986 | Takahashi et al. | 324/252 X |

FOREIGN PATENT DOCUMENTS

| | | | |
|---|---|---|---|
| 1394483 | 2/1965 | France . | |
| 156656 | 12/1979 | Japan | 324/208 |
| 0129303 | 8/1983 | Japan | 324/208 |
| 0196619 | 10/1985 | Japan | 324/208 |
| 2096421 | 10/1982 | United Kingdom | 324/207 |

Primary Examiner—Gerard R. Strecker
Attorney, Agent, or Firm—Antonelli, Terry & Wands

[57] ABSTRACT

The present invention relates to an apparatus for magnetically detecting positions and intends to provide a position detecting apparatus of the kind with high accuracy in which when recording magnetic signals of a predetermined length on magnetization tracks, a plurality of recording units are continuously arranged in the direction of the magnetization track and are set as the predetermined recording length, thereby sharpening the output waveform of the signal corresponding to the edge portion of the magnetization recording length. The present invention is suitable for the absolute type having a plurality of magnetization tracks.

14 Claims, 6 Drawing Sheets

APPARATUS FOR MAGNETICALLY DETECTING POSITIONS WITH MINIMUM LENGTH MAGNETIC INFORMATION UNITS RECORDED ON A PLURALITY OF MAGNETIC TRACKS

This application is a continuation of application Ser. No. 560,178, filed Dec. 12, 1983, now abandoned.

The present invention relates to an apparatus for magnetically detecting position. More particularly, the present invention is applied to an apparatus of the kind which is attached to a rotatable shaft of a rotatable electrical machine and the like, thereby detecting the rotated position of the rotatable shaft or rotating speed, or to an apparatus which is attached to an arm of a robot which moves straight or a machine for moving a predetermined object, thereby similarly detecting the position on its straight line or the moving speed.

Furthermore, the present invention has a plurality of tracks on which magnetic signals were respectively recorded and is suitable for detection of absolute values of the positions by means of the respective magnetic signals.

Various apparatuses for magnetically detecting position have been proposed; above all, as an apparatus for detection of absolute values as a preferred embodiment of the present invention, the invention of Ito et al (U.S. Pat. No. 4,274,053) has been known. The present invention is applied not only to the absolute type which has a plurality of tracks and thereby to detect the absolute values of the positions but also to the incremental type having a single track; however, the absolute type is discussed as an example. In addition, although the present invention may be similarly applied to both rotatable machines and machines which move straight, the rotatable type is described as an example.

Figure 1:
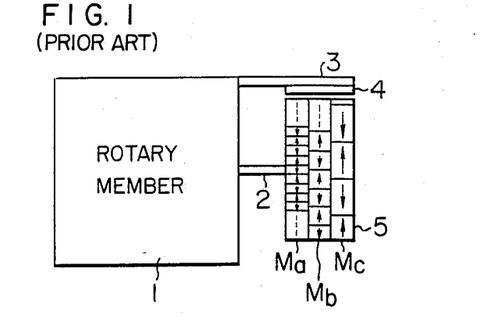
FIG. 1 is a constructional diagram showing the principle of a conventional absolute type position detecting apparatus.
Figure 2:
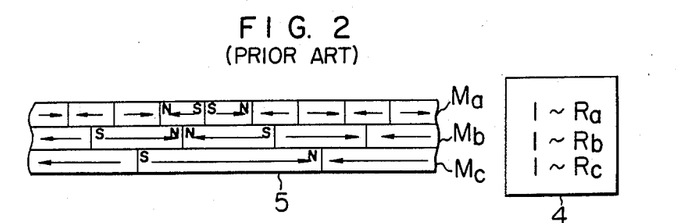
FIG. 2 shows developing diagrams of the rotary drum and magnetic sensor of the apparatus of FIG. 1.

FIG. 1 is a constructional diagram showing the principle of the invention of Ito et al, in which it is illustrated as three tracks in place of five tracks. FIG. 2 shows developing diagrams of the rotary drum and magnetic sensor, and FIG. 3 shows resistance change waveform diagrams of the magneto-resistance effect devices.

In the diagrams, reference numeral 1 denotes a rotary member which is a rotary member to be detected, e.g., a motor; 2 a rotatable shaft thereof; 3 an attaching base; 4 a magnetic sensor having magnetic detecting devices; and 5 a rotary drum adapted to support a plurality of magnetizating tracks $M_a$–$M_c$; $R_a$–$R_c$ denote magnetic detecting devices, e.g., magneto-resistance effect devices each facing the above magnetization tracks $M_a$–$M_c$.

This example shown here is constituted by the rotary drum 5 and the magnetic sensor 4. This rotary drum 5 is supported through the rotatable shaft 2 to the rotary member 1 which is the rotary member to be detected and has a plurality of magnetization tracks $M_a$–$M_c$. Magnetic signals for the magnetic recording medium have been recorded adjacently on each of the above-mentioned tracks using different recording wavelengths of N-S such as shown in FIG. 2. On the other hand, the magnetic sensor 4 is disposed closely to the above magnetization tracks $M_a$–$M_c$, respectively, and attached to the rotary member 1 by the attaching base 3. The magnetic signals as shown in FIG. 3 obtained as the resistance of the magneto-resistance effect devices $R_a$–$R_c$ changes. The resistance change waveforms are then shaped, thereby to obtain the three-bit absolute signals.

Figure 3:
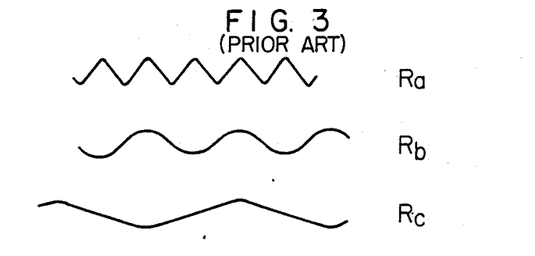
FIG. 3 shows resistance change waveform diagrams of the magneto-resistance effect devices of FIG. 2.

However, as is obvious from FIG. 3, according to such an apparatus shown, the magnetic signals indicated by the arrows in the diagrams recorded adjacently on each of the magnetization tracks $M_a$–$M_c$ have various wavelengths and their polarities are not coincident at all; therefore, there is a fear of mutual magnetic interference and it is considered that there is a fear such that it is diffucult to obtain the signals in accordance with the resistance change waveforms as shown in FIG. 3.

In addition, since the wavelengths of the magnetic signals which correspond to the recording signals differ largely from each other in dependence upon the respective magnetization tracks $M_a$–$M_c$, this causes different magnetic field distributions on the surfaces of the magnetic recording mediums of the rotary drum 5. In other words, in the magnetization tracks $M_a$ where the magnetic signal has a short wavelength, the output such as shown in FIG. 3 is obtained on the surface of the magnetic recording medium, but the magnetic field becomes very weak in the location slightly apart from the surface. On the other hand, in the magnetization track $M_c$ where the magnetic signal has a long wavelength, the magnetic field distribution becomes pulsive on the surface of the magnetic recording medium, but the magnetic field becomes weak in the location apart from the surface, so that there is a fear such that the output such as shown in FIG. 3 cannot be derived.

Furthermore, if a strong magnet is used for the portions where the magnetic signal has a long wavelength, such as for the magnetization track $M_c$ in order to obtain the outputs as shown in FIG. 3, in recording the magnetic signal, other magnetization tracks $M_a$ and $M_b$ will be contrarily largely affected due to the strong magnetic field caused by that magnet. As a result of this, there is a drawback peculiar to the absolute type such that it is difficult to increase the number of bits.

In addition to the above drawback, in the portions where the magnetic signal has a long wavelength, e.g., in the magnetization track $M_c$, the edge portion of the output waveform becomes dull and this makes it difficult to obtain the accurate edge when shaping the waveform into the square wave; therefore, there is a drawback such that it is impossible to realize a magnetic rotary sensor with high degree of accuracy. This drawback is similarly caused even in the incremental type having a single magnetization track.

It is a main object of the present invention to provide an apparatus for highly accurately detecting positions which can sharpen the output waveform edge portion corresponding to the edge portion of the recording wavelength recorded in the magnetization track, thereby to improve the accuracy of the edge when shaping the waveform.

Another object of the present invention is to provide an apparatus for detecting positions of the absolute (absolute position) type with high resolution which enables the signals to be detected with similar sensitivity even in each of magnetization tracks where the magnetic signals have different recording widths and at the same time which eliminates the magnetic interference between the respective magnetization tracks, thereby to sharpen the edge portions of the output waveforms.

According to the present invention, when recording a magnetic signal of a predetermined wavelength in a magnetization track, a plurality of recording units are continuously arranged in the direction of the magnetization track to constitute a predetermined recording wavelength.

Furthermore, in case of realizing the absolute constitution by arranging a plurality of magnetization tracks, the position detecting apparatus is constituted by a plurality of magnetic tracks, on each of the tracks the magnetic recording mediums with different recording widths have been recorded, and magnetic detecting devices respectively arranged closely to each of the above-mentioned magnetic tracks; the absolute position of the rotary member to be detected can be detected on the basis of the detection signals having different widths or lengths which signals are obtained by these magnetic detecting devices; respective predetermined number of magnetic recording mediums consisting of the minimum recording units are successively recorded in the direction of each track, thereby consituting a plurality of magnetic tracks on which the magnetic recording mediums have been recorded with different recording widths or lengths.

In more detail, the minimum recording units of the magnetic recording mediums are made identical for each magnetization tracks; its recording width can be changed by successively and individually recording the magnetic recording mediums consisting of the minimum recording units and at the same time by interposing the distances each corresponding to the continuous length; and two magneto-resistance effect devices to be disposed so as to face the track are used for one magnetization track, thereby obtaining the signals with different recording widths on the basis of each magnetization track.

The present invention will be apparent from the following detailed description taken in conjunction with the accompanying drawings, in which.

The constitution of the present invention will be described hereinbelow as an example whereby the absolute position of the rotation is detected. The example shown herein is only one example, and the present invention includes the incremental type by means of a single track, the straight moving type, and the type of which magnetization tracks and magneto-resistance effect devices relatively move.

Figure 4:
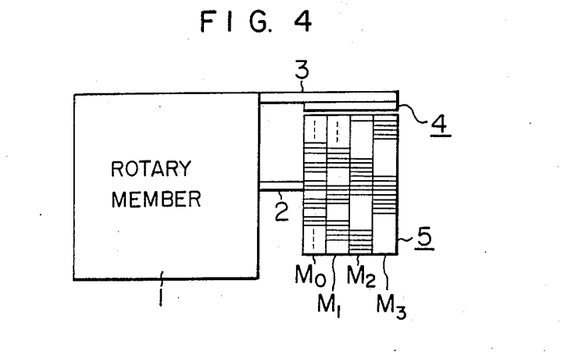
FIG. 4 is a principle constructional diagram showing one embodiment of the present invention.
Figure 5:
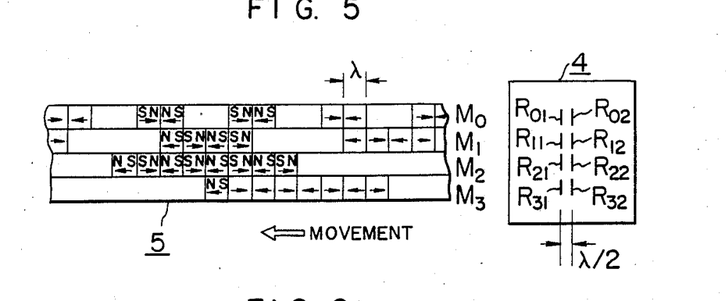
FIG. 5 shows developing diagrams of the rotary drum and magnetic sensor of the magnetic rotary sensor according to one embodiment of the present invention.
Figure 6:
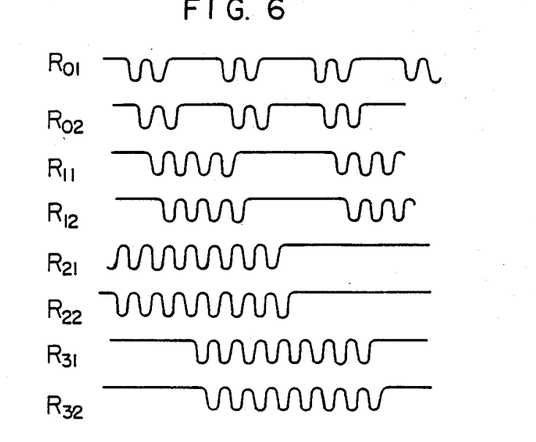
FIG. 6 shows resistance change waveforms of the magneto-resistance effect devices.
Figure 7:
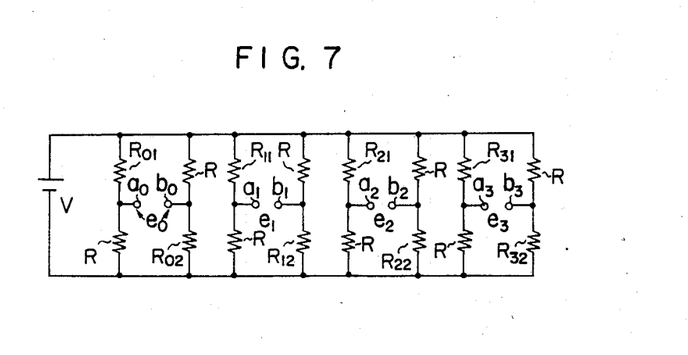
FIG. 7 is a bridge connection diagram of the magneto-resistance effect devices.
Figure 8:
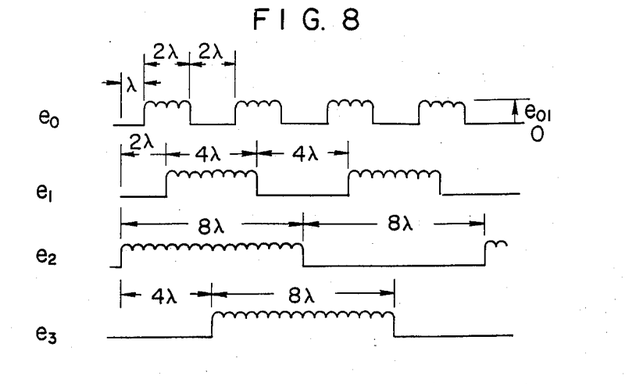
FIG. 8 shows output voltage waveforms of the bridge.
Figure 9:
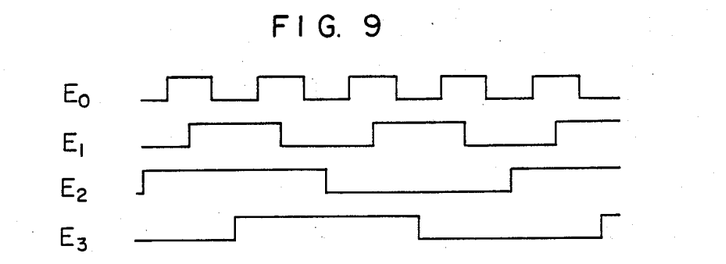
FIG. 9 shows waveform diagrams after the output voltage waveforms were shaped.

FIG. 4 is an external side elevational view showing the schematic constitution of the present invention. FIG. 5 shows developing diagrams of the rotary drum and magnetic sensor of the magnetic rotary sensor according to one embodiment of the present invention. FIG. 6 shows resistance change waveform diagrams of the magneto-resistance effect devices. FIG. 7 is a bridge connection diagram of the magneto-resistance effect devices. FIG. 8 shows output voltage waveform diagrams of the bridge. FIG. 9 shows waveform diagrams after the output voltage waveforms were shaped.

In the figures, a reference numeral 4 denotes the magnetic sensor in which magneto-resistance effect devices (hereinbelow, referred to as MR devices) $R_{01}$–$R_{32}$ according to the magnetic detecting devices are arranged, and 5 denotes the rotary drum having four magnetization tracks $M_0$–$M_3$, on each track the magnetic signals with different recording widths according to the magnetic recording medium have been recorded.

This embodiment relates to a magnetic rotary sensor of the absolute position type having four-bit gray code having a resolution which is 1/16 of the magnetic rotary sensor in which it is constituted by the magnetic sensor 4 and rotary drum 5 as shown in FIG. 4 in place of the magnetic sensor and rotary drum in the magnetic rotary sensor shown in FIG. 1 described previously.

That is to say, the rotary drum 5 is divided into four magnetization tracks $M_0$–$M_3$ on which the magnetic signals, each of which is recorded on the magnetic recording medium and has a wavelength $\lambda$ of the minimum recording unit of the N-S polarity as indicated by the arrows in FIG. 5 have been recorded. This wavelength $\lambda$ which is the minimum recording unit is made equal to the resolution of the relevant magnetic rotary sensor.

On the magnetization track $M_0$ with regard to the least significant bit, two magnetic signals each having a wavelength $\lambda$ are successively recorded and then the blank corresponding to such two signals follows, i.e., no signals are recorded in this blank, and thereafter the two magnetic signals are similarly recorded; in this way, this pattern is repeated as shown in FIG. 5. In this case, the magnetic recording length is $2\lambda$. The above-mentioned blank portion is the perfect blank portion where no magnetic flux exist and other blanks are similar to that.

On the next magnetization track $M_1$ with respect to the second bit, four magnetic signals each having a wavelength $\lambda$ are continuously recorded and then the blank portion corresponding to such four signals follows, i.e., four signals are not recorded in this portion at all; in this way, this pattern is likewise repeated. The magnetic recording length in this case is $4\lambda$.

On the next magnetization track $M_2$ relating to the third bit, eight magnetic signals each having a wavelength $\lambda$ are continuously recorded and then the blank portion corresponding to such eight signals follows in the same manner as above. The magnetic recording wavelength in this case is $8\lambda$.

On the other hand, the magnetization track $M_3$ with regard to the most significant bit has the same magnetic recording wavelength $8\lambda$ as that of the above-mentioned magnetization track $M_2$, but their phases are different.

In other words, the magnetic recording lengths of the magnetization signals on the magnetization tracks $M_0$, $M_1$, $M_2$, and $M_3$ are $2\lambda$, $4\lambda$, $8\lambda$, and $8\lambda$, respectively, and the phases of the magnetization tracks $M_0$, $M_1$ and $M_3$ are out of phase by $\lambda$, $2\lambda$ and $4\lambda$ from the phase of the magnetization track $M_2$.

Furthermore, the magnetic signals are recorded in the manner such that the N-S polarities of the adjacent magnetic signals each having a wavelength $\lambda$ on each magnetization track are identical in the lateral direction of the tracks, respectively, as shown in FIG. 5.

The magnetic sensor 4 will now be described. The MR devices are disposed closely to each of the above-mentioned magnetization tracks. Namely, as shown in FIG. 5, a pair of MR devices $R_{01}$ and $R_{02}$ which relate to the least significant bit are disposed to face the magnetization track $M_0$; similarly, the MR device pairs $R_{11}$, $R_{12}$, and $R_{21}$, $R_{22}$, and $R_{31}$, $R_{32}$ with respect to the second, third and most significant bits are arranged to face the magnetization tracks $M_1$–$M_3$, respectively.

In addition, the MR devices $R_{01}$ and $R_{02}$; $R_{11}$ and $R_{12}$; $R_{21}$ and $R_{22}$; and $R_{31}$ and $R_{32}$ are respectively disposed in the positions which are apart by $\lambda/2$ (i.e., the half of the wavelength $\lambda$) from each other. Moreover, the respective MR devices are arranged in a line as shown in FIG. 5.

In this constitution, when a magnetic field perpendicular to the longitudinal direction of the MR devices $R_{01}$–$R_{32}$ is applied, their resistance values decrease and this characteristic is utilized here.

Namely, when the rotary drum 5 is moved in the direction indicated by an arrow in the arrangement as shown in FIG. 5, the resistances of the MR devices $R_{01}$–$R_{32}$ change as shown in FIG. 6, respectively.

It will be appeciated from FIG. 6 that in any cases, the waveform edge portions become sharp since each resistance value changes with the minimum recording unit basis which unit has a wavelength $\lambda$.

By constructing resistance bridges for each magnetization track respectively, as shown in FIG. 7, which bridge circuits are constituted by the MR devices $R_{01}$–$R_{32}$ in the magnetic rotary sensor as described above, and resistors R, namely, other MR devices or resistors R regarding resistive materials which are arranged so as not to be affected by the magnetic field of the rotary drum 5 which was disposed for example to the magnetic sensor 4 or was separately attached and disposed, and by applying voltages to each of these bridges from a power supply V, the absolute position can be detected in the following modes.

That is, assuming that the output voltage between output terminals $a_0$ and $b_0$ which are the detection terminals regarding the least significant bit of the magnetization track $M_0$ is $e_0$; that the output voltage between output terminals $a_1$ and $b_1$ with respect to the second bit is $e_1$ similarly; and that the output voltages between output terminals $a_2$ and $b_3$ relating to the third bit and between $a_3$ and $b_3$ regarding the most significant bit are $e_2$ and $e_3$, respectively, the waveform edge portions of these output voltages $e_0$–$e_3$ of the magnetization tracks $M_0$–$M_3$ become similary sharp as shown in FIG. 8 even when the widths of the output signals are different.

FIG. 8 shows waveform diagrams with respect to the amplitude of the voltage $e_{01}$ corresponding to the sum of voltage changes due to the resistance changes of FIG. 6.

When the waveforms of these output voltages $e_0$–$e_3$ are shaped by an amplifier or voltage comparator, their waveforms $E_0$–$E_3$ become as shown in FIG. 9.

These outputs $E_0$–$E_3$ are four-bit gray code outputs and the signal change of each bit has a phase difference of $\lambda$, so that the absolute positions of 16 equal parts can be detected.

As described above, in the present constitution, the magnetic signals as described with respect to FIG. 5 are recorded, and the polarities of the adjacent magnetization tracks in the lateral direction thereof are identical, i.e., they are the same N polarity or the same S polarity, so that this causes the mutual repulsion and therefore the magnetic interference does not occur. In addition, since the magnetic signals can be recorded on the basis of the waveform with respect to the same minimum recording unit, the magnetic field distributions of the respective magnetization tracks are aligned and their output levels of the magnetization tracks are almost equal, thereby enabling the stable outputs to be obtained. This is particularly effective when the absolute positions are detected in response to the magnetic signals of a plurality of tracks.

Furthermore, since the edge portions of the output waveforms change sharply, detection accuracy and resolution can be improved. In the above embodiment, the minimum recording unit is equivalent to the resolution of the relevant magnetic rotary sensor; however, if it is reduced to less than that resolution or to a factor of integer thereof, the output waveform edge portion can be further shaped. This effect can be also derived even in the incremental type position detecting apparatus having a single track.

Moreover, in the above embodiment, although an example of four bits has been shown, similar effect will be obtained even if the number of bits increases to five bits of the resolution of 1/32 or eight bits of the resolution of 1/256. The gray code is frequently used as a magnetic rotary sensor since only one bit changes at any time to change a value by one step. However, a similar effect can be obtained even when using a binary code of which two or more bits together change.

Although there is a positional difference of only $\lambda/2$ (half of the wavelength $\lambda$) between the MR devices for each track in the above embodiment, this wavelength difference may be selected to $(n-\frac{1}{2})\lambda$ (where, n is an integer), and a similar effect can be also obtained even in this case.

Another embodiment of the present invention will be then described with reference to FIGS. 10-14.

This embodiment used two magnetization tracks for each bit and relates to the four-bit gray code in which the output voltages are increased.

Figure 10:
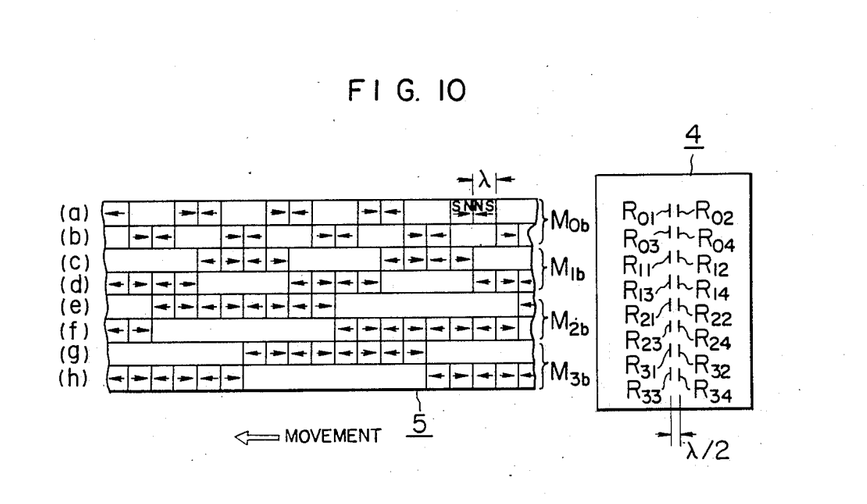
FIG. 10 shows developing diagrams of the rotary drum and magnetic sensor of the magnetic rotary sensor according to another embodiment of the present invention.
Figure 11:
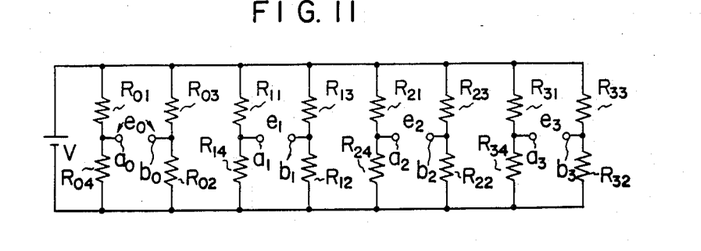
FIG. 11 is a bridge connection diagram of the magneto-resistance effect devices.
Figure 12:
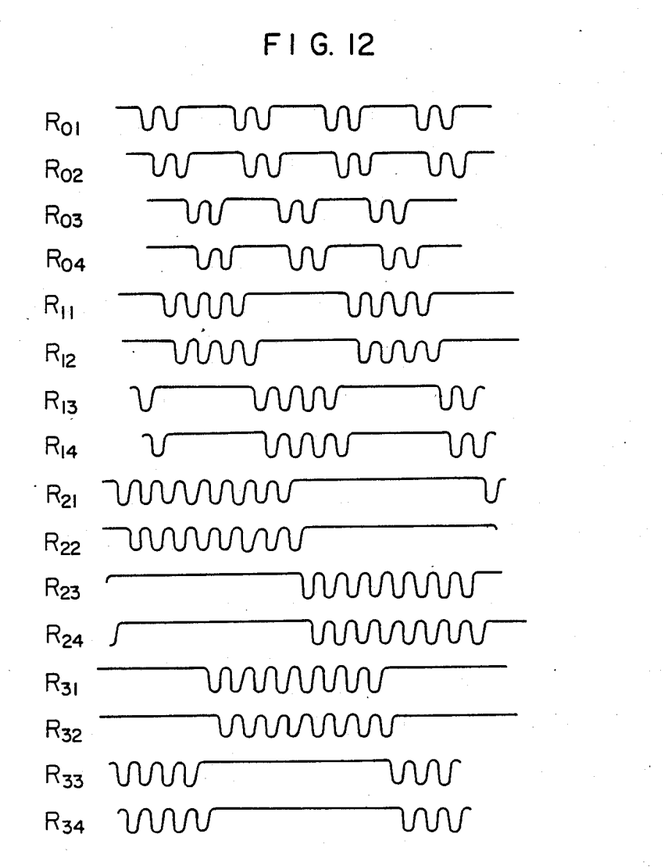
FIG. 12 shows resistance change waveform diagrams of the magneto-resistance effect devices.
Figure 13:
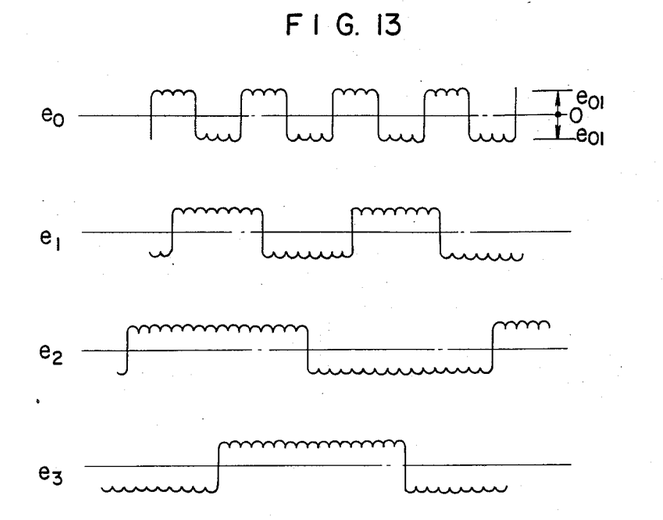
FIG. 13 shows output voltage waveform diagrams of the bridge.
Figure 14:
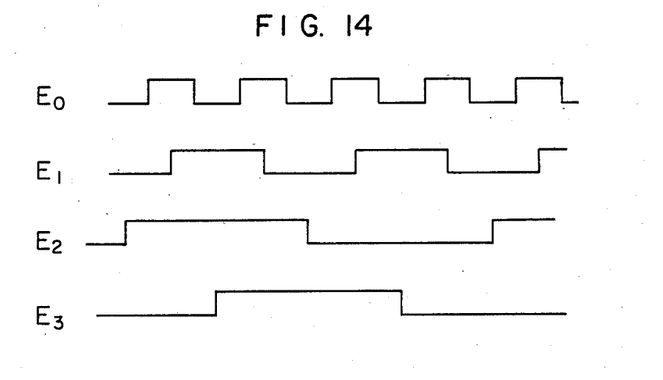
FIG. 14 shows waveform diagrams after the out put voltage waveforms were shaped.

FIG. 10 shows developing diagrams of the rotary drum and magnetic sensor of the magnetic rotary sensor according to another embodiment of the present invention. FIG. 11 is a bridge connection diagram of the MR devices. FIG. 12 shows resistance change waveform diagrams of the MR devices. FIG. 13 shows output voltage waveform diagrams of the bridges. FIG. 14 shows waveform diagrams after the output voltage waveforms were shaped.

In the diagrams, reference numeral 4 denotes the magnetic sensor to which the MR devices $R_{01}$–$R_{34}$ as the magnetic detecting devices are disposed, and 5 indicates the rotary drum having magnetization tracks $M_{0b}$–$M_{3b}$, on each track the magnetic signals with different magnetic recording lengths according to the magnetic recording medium have been recorded, wherein two magnetization tracks with respect to the same bit are combined and are used as a pair, respectively.

The present embodiment relates to an absolute position type magnetic rotary sensor having the four-bit gray code as described above and is constituted by the magnetic sensor 4 and rotary drum 5 as shown in FIG. 10 in the same manner as in the former embodiment in place of the magnetic sensor and rotary drum in the magnetic rotary sensor shown in FIG. 1.

That is to say, the rotary drum 5 is divided into eight tracks (a)–(h). As shown by the arrows in FIG. 10, the magnetic signals with respect to the magentic recording medium of a wavelength $\lambda$ of the N-S polarity which are similar to the former magnetic signals are recorded on these eight magnetization tracks (a)–(h). The magnetization tracks $M_{0b}$–$M_{3b}$ corresponding to the least significant, second, third, and most significant bits with respect to the magnetization tracks of each one bit are constituted by each two magnetization tracks, i.e., (a) and (b); (c) and (d); (e) and (f); and (g) and (h). The wavelength $\lambda$ equivalently corresponds to the resolution (1/16) of the relevant magnetic rotary sensor.

The pattern of the magnetization track (a) in the magnetization track $M_{0b}$ regarding the least significant bit is the same recording pattern of the magnetization track $M_0$ in the former embodiment. On the contrary, no magnetic signal is recorded in the portion of the magnetization track (b) corresponding to the portion of the magnetization track (a) in which the magnetic recording medium was recorded. On the other hand, the magnetic signal is recorded in the portion of the track (b) corresponding to the portion of the track (a) in which it is not recorded.

Likewise, the magnetization tracks (c), (e) and (g) of the magnetization tracks $M_{1b}$, $M_{2b}$ and $M_{3b}$ with respect to the second, third and most significant bits have the same recording patterns of the magnetization tracks $M_1$, $M_2$ and $M_3$ in the former embodiment. On the contrary, the magnetic recording mediums are recorded on the magnetization tracks (d), (f) and (f) under the same recording conditions as those in the former embodiment. Each pair of these magnetization tracks constitutes the magnetization tracks $M_{1b}$, $M_{2b}$ and $M_{3b}$ with respect to the same bit.

The magnetic signals each having a wavelength $\lambda$ are recorded on each magnetization track in the same manner as in the former embodiment such that the polarities of N or S of the adjacent tracks are identical in the lateral direction of the tracks.

The MR devices $R_{01}$–$R_{04}$, $R_{11}$–$R_{14}$, $R_{21}$–$R_{24}$, and $R_{31}$–$R_{34}$ with respect to the least significant, second, third, and most significant bits are disposed in the magnetic sensor 4 as shown in FIG. 10 so as to face the magnetization tracks $M_{0b}$–$M_{3b}$ with respect to the least significant, second, third, and most significant bits, respectively. In addition, the MR devices $R_{01}$, $R_{03}$, $R_{11}$, $R_{13}$, $R_{21}$, $R_{23}$, $R_{31}$, and $R_{33}$ are arranged in a line. Similarly, the MR devices $R_{02}$, $R_{04}$, $R_{12}$, $R_{14}$, $R_{22}$, $R_{24}$, $R_{32}$, and $R_{34}$ are arranged in a line; however, there is a positional difference of only $\lambda/2$ between the former line and the latter line.

With such an arrangement, when the rotary drum 5 is moved in the direction indicated by the arrow in FIG. 10, the resistances of the above-mentioned MR devices $R_{01}$–$R_{34}$ change as shown in FIG. 12, respectively.

The bridges are constituted for each bit using these MR devices as shown in FIG. 11. When the voltages are applied to these bridges from the power supply V, the voltage $e_0$ between the output terminals $a_0$ and $b_0$ of the least significant bit shown in FIG. 11, the voltage $e_1$ between the output terminals $a_1$ and $b_1$ of the second bit, the voltage $e_2$ between the output terminals $a_2$ and $b_2$ of the third bit, and the voltage $e_3$ between the output terminals $a_3$ and $b_3$ of the most significant bit become as shown in FIG. 13. It is therefore possible to obtain the voltage which is about twice the amplitude of the output voltage shown in FIG. 8 in the former embodiment.

In this embodiment also, the output waveform edge portions of each bit change sharply similarly.

When the above-mentioned output voltages $e_0$–$e_3$ are waveform-shaped by an amplifier or voltage comparator, their output waveforms $E_0$–$E_3$ are as shown in FIG. 14, so that the four-bit gray code is obtained.

From the above description, according to this embodiment, it is possible to expect an effect similar to the former embodiment and to enlarge the amplitude of the output voltage, thereby enabling the accuracy to be improved. In addition, the wavelength with respect to the minimum recording unit can be selected to various values and the number of bits may be increased similarly to the former embodiment.

Each of the above-described embodiments has the rotary drum 5 attached to the rotary member 1 through the rotatable shaft 2. The magnetically recorded tracks are supported on the outer peripheral surfaces of the rotary drum 5. However, as such as rotary drum, it is possible to use the rotary disk type drum which has the magnetically recorded tracks on its edge surface.

Figure 15:
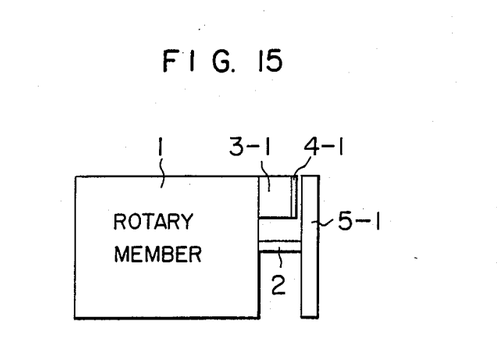
FIG. 15 is a constructional diagram showing a magnetic rotary sensor according to another embodiment of the present invention.
Figure 16:
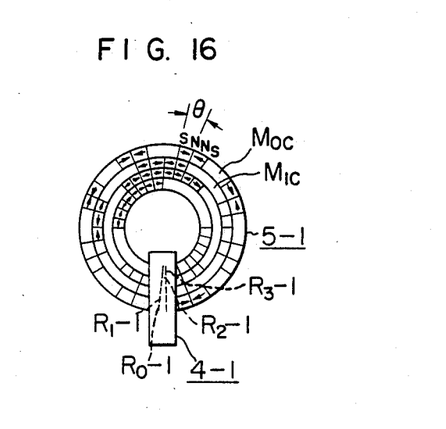
FIG. 16 shows developing diagrams of the rotary disk and magnetic sensors.

That is to say, FIGS. 15 and 16 show one embodiment constituted by the rotary disk type.

FIG. 15 is a constructional diagram of a magnetic rotary sensor according to another embodiment of the present invention. FIG. 16 shows developing diagrams of the rotary disk and magnetic sensor.

In the diagrams, a reference numeral 3-1 denotes an attaching base; 4-1 indicates a magnetic sensor in which MR devices $R_0$-1, $R_1$-1, $R_2$-1, and $R_3$-1 with respect to the magnetic detecting devices are disposed; and 5-1 is a rotary disk having four magnetization tracks $M_{0c}$ to $M_{3c}$, on each track the magnetic signals regarding the magnetic recording medium having different recording widths have been recorded. Numeral 1 denotes the same rotary member as that in the former embodiment and 2 is the rotatable shaft.

Namely, the magnetization track $M_{0c}$ with respect to the least significant bit, the magnetization tracks $M_{1c}$ and $M_{2c}$ regarding the 2nd and 3rd bits, and the magnetization track $M_{3c}$ with respect to the most significant bit are arranged sequentially concentrically from the outer periphery on the rotary disk 5-1. The MR device pairs $R_0$-1, $R_1$-1, $R_2$-, and $R_3$-1, each consisting of two MR devices of the magnetic sensor 4-1 are disposed in a line closely to those magnetization tracks $M_{0c}$–$M_{3c}$ so as to face them, respectively.

In this case, the minimum recording unit is an angle $\theta$.

Even in this embodiment, an effect similar to that of the former embodiment can be expected.

In addition, the recording of the magnetic signals with respect to the magnetic recording medium in each embodiment also includes the arrangement of thin permanent magnets.

Although the present invention is constituted as described above, it includes the following apparatuses as previously mentioned.

(a) Apparatus of the type in which the magnetically recorded tracks are moved in the direction of a straight line.

(b) Apparatus of the incremental type having only a single magnetically recorded track.

(c) Apparatus of the absolute type having a plurality of magnetically recorded tracks.

(d) Apparatus in which the magnetically recorded tracks and magnetic sensor are relatively moved.

(e) Apparatus in which the magnetically recorded tracks are stationary but the magnetic sensor is moved.

(f) Apparatus in which the magnetic tracks are disposed on the outer periphery of the rotary drum or on the side surface of the rotary disk.

(g) Other apparatuses each having a uniform constitution without departing from the present invention.

According to the present invention, the following effects can be mainly obtained.

(a) Even in case of the recording signals each having a wide or narrow recording width, their output edge portions are similarly sharp, thereby enabling high accuracy and high resolution to be obtained.

(b) Even in case of the multimagnetization tracks having different recording widths, it is possible to detect the recording signals with the same sensitivity.

(c) It is possible to detect the recording signals on the magnetization tracks without causing the magnetic interference between the magnetization tracks having different recording widths.

We claim:

1. An apparatus for magnetically detecting positions comprising:
   a plurality of magnetic tracks, each track having at least one portion therealong where magnetic information is recorded and at least one other portion where magnetic information is not recorded, the magnetic recorded information portion extending over a different predetermined length for at least two of said plurality of tracks, each different predetermined length magnetic information recorded portion for a respective track comprising a different number of the same minimum length magnetic information units recorded continuously along the direction of extension of a respective track, each different predetermined length magnetic information recorded portion including at least two adjacent minimum length magnetic information units, each of the minimum length magnetic information units generating a magnetic signal for detection;
   magnetic sensing means disposed closely to said magnetic tracks for detecting the magnetic information recorded on said magnetic tracks and providing signals indicative of the actual length of each magnetic information recorded portion on each of said tracks so that the signals provided represent a binary 1 and binary 0 assuming that the magnetic information recorded portion of each track represents one of a binary 1 and 0 and the other portion of each track where magnetic information is not recorded represents the other of a binary 1 and 0, said magnetic sensing means including magnetic sensing devices for each track, each of said sensing devices being in the form of two magnetoresistive elements adapted for connection as part of a processing circuit and spaced a predetermined length along the track direction, each of said elements having an internal resistance which changes in accordance with the intensity of a magnetic field in the same manner irrespective of the difference of polarity of the magnetic field, and
   means for moving said magnetic tracks and said magnetic sensing means relative to one another so that the signals detected by said magnetic sensing means are indicative of a respective portion.

2. An apparatus according to claim 1, wherein said plurality of magnetic tracks are supported by a rotary member, and said magnetic detecting devices provide signals indicative of the magnetic information recorded by said minimum recording units on said tracks as an indication of the absolute position of said rotary member.

3. An apparatus according to claim 2, wherein each minimum recording unit comprises an N pole portion and an S pole portion extending in the direction of the track, said minimum recording units being continuously recorded along the direction of said track so that the N pole portion of one minimum recording unit is adjacent an N pole portion of an adjacent minimum recording unit and the S pole portion of one minimum recording unit is adjacent an S pole portion of an adjacent minimum recording unit.

4. An apparatus according to claim 2, wherein said minimum recording units to be recorded on the tracks are recorded so as to be arranged on the same line crossing said tracks.

5. An apparatus according to claim 2, wherein the magnetic recording mediums of the minimum recording units to be recorded on the tracks are recorded so as to be arranged on the same line crossing said tracks, and wherein the polarities of said magnetic recording mediums recorded on the same line are identical.

6. An apparatus according to claim 2, wherein two tracks are constituted as a pair and said two tracks are divided into portions where said minimum recording units are magnetically recorded continuously and portions where the recording is not performed, and wherein the portions of one of said two tracks corresponding to the recorded portions of the other track are used as the nonrecording portions, while the portions of one of said two tracks corresponding to the nonrecording portions of the other track are made recorded portions.

7. An apparatus according to claim 2, wherein the minimum recording units to be magnetically recorded on the tracks are continuously recorded in the manner such that the polarities of the minimum recording units of the adjacent tracks are identical to each other.

8. An apparatus according to claim 2, wherein the minimum recording unit to be magnetically recorded on the tracks is equal to the resolution of said magnetic rotary sensor or is lower than that resolution or is one made by dividing said resolution by an integer.

9. An apparatus according to claim 2, wherein said magnetic detection devices to be disposed closely to said magnetic tracks are arranged on the same line crossing the tracks.

10. An apparatus according to claim 2, wherein the distance between said two magnetoresistive elements is $(n-\frac{1}{2})\lambda$, wherein a length of the minimum recording unit of the magnetic recording medium is $\lambda$ and n is an integer.

11. An apparatus according to claim 10, wherein two magnetoresistive elements which are not affected by the magnetic fields from the magnetic tracks, or two resistors are disposed to constitute a bridge together with said two magnetoresistive elements disposed for one magnetic track.

12. An apparatus according to claim 2, wherein two tracks are constituted as a pair and said two tracks are divided into portions where said minimum recording units are magnetically recorded continuously and portions where the recording is not performed, and wherein the portions of one of said two tracks corresponding to the recorded portions of the other track are used as the nonrecording portions, while the portions of one of said two tracks corresponding to the nonrecording portions of the other track are used as the recorded portions, and wherein two magnetic sensing devices to be bridge connected are disposed to said pair of two magnetic tracks.

13. An apparatus according to claim 1, wherein the at least one other portion of a respective track where magnetic information is not recorded is a blank portion having substantially no magnetic flux and having the same length as the magnetic recorded portion of predetermined length of the respective track, whereby the signal detected by said magnetic sensing means of a respective track includes a portion having a length which is the same as the total length of the number of the minimum length magnetic information units recorded continuously along the direction of the respective track and a portion of the same length where there is no signal.

14. An apparatus according to claim 13, wherein for each respective track, the blank portion having substantially no magnetic flux and of the same length as the magnetic recorded information portion of predetermined length exists on both sides of the magnetic recorded information portion of predetermined length.

* * * * *